US008482362B1

(12) United States Patent
Podell

(10) Patent No.: US 8,482,362 B1
(45) Date of Patent: Jul. 9, 2013

(54) COMBINER/DIVIDER WITH INTERCONNECTION STRUCTURE

(75) Inventor: Allen F. Podell, Palo Alto, CA (US)

(73) Assignee: Werlatone, Inc., Brewster, NY (US)

( * ) Notice: Subject to any disclaimer, the term of this patent is extended or adjusted under 35 U.S.C. 154(b) by 0 days.

(21) Appl. No.: 13/586,684

(22) Filed: Aug. 15, 2012

(51) Int. Cl.
*H03H 7/38* (2006.01)
*H01P 5/12* (2006.01)

(52) U.S. Cl.
USPC .............. 333/131; 333/26; 333/127; 333/134

(58) Field of Classification Search
USPC .................................... 333/26, 127, 131, 134
See application file for complete search history.

(56) References Cited

U.S. PATENT DOCUMENTS

| | | | |
|---|---|---|---|
| 3,239,781 | A | 3/1966 | Podell |
| 3,311,850 | A | 3/1967 | Podell |
| 3,325,587 | A | 6/1967 | Sontheimer |
| 3,327,220 | A | 6/1967 | Podell |
| 3,399,340 | A | 8/1968 | Podell |
| 3,508,171 | A | 4/1970 | Podell |
| 4,647,868 | A | 3/1987 | Mueller |
| 4,774,481 | A | 9/1988 | Edwards et al. |
| 4,916,410 | A | 4/1990 | Littlefield |
| 5,121,090 | A | 6/1992 | Garuts et al. |
| 5,285,175 | A | 2/1994 | Edwards |
| 5,461,349 | A | 10/1995 | Simons |
| 5,745,017 | A | 4/1998 | Ralph |
| 5,982,252 | A | 11/1999 | Werlau |
| 6,246,299 | B1 | 6/2001 | Werlau |
| 6,407,648 | B1 | 6/2002 | Johnson |
| 6,486,749 | B1 | 11/2002 | Tichauer et al. |
| 6,750,752 | B2 | 6/2004 | Werlau |
| 7,692,512 | B2 | 4/2010 | Podell |
| 2011/0074519 | A1 | 3/2011 | Podell |

OTHER PUBLICATIONS

U.S. Appl. No. 13/586,649, filed Aug. 30, 2012; inventor Allen F. Podell title Combiner/Divider with Coupled Transmission Line.
U.S. Appl. No. 13/586,714, filed Aug. 15, 2012; inventor Allen F. Podell; title Planar Circuit Structures.
U.S. Patent and Trademark Office; Office Action for U.S. Appl. No. 13/586,649; notification date Mar 29, 2013; 6 pages.

*Primary Examiner* — Robert Pascal
*Assistant Examiner* — Kimberly Glenn
(74) *Attorney, Agent, or Firm* — Kolisch Hartwell, PC

(57) ABSTRACT

A combiner/divider circuit may include first, second, third, fourth and fifth transmission lines each including a signal conductor and a signal-return conductor. The signal conductors at a first end of the first transmission line may form a first unbalanced sum signal terminal and the signal conductors at first ends of the second, third, fourth, and fifth transmission lines may form pairs of balanced signal terminals. The signal conductor at a second end of the first transmission line may be connected to the signal conductors at second ends of the fourth and fifth transmission lines. The signal conductors at second ends of the second and third transmission lines may be connected to the signal-return conductors at second ends of the fourth and fifth transmission lines, respectively. The second ends of the transmission lines may extend into the connection region along a common line.

19 Claims, 3 Drawing Sheets

COMBINER/DIVIDER WITH INTERCONNECTION STRUCTURE

BACKGROUND

This application is directed to combiner/divider circuits, and in particular, combiner/divider circuits having interconnected coaxial transmission lines. High power broadband communication systems require high power broadband antennas. Often these antennas have an input impedance that does not match the desired transmitter or receiver with which it is used. In such circumstances, baluns can be used to transform the impedance of the antenna to the impedance of the transmitter or receiver, or to convert between an unbalanced signal and a balanced signal. When large bandwidths are desired, coaxial baluns are often used.

Simple signal sources have two terminals, a source terminal and a return terminal, where most commonly a ground plane is used for the return path. The ground plane return simplifies circuit wiring, as a single conductor and the ground plane below form a complete signal path. The voltage on the ground plane is then the reference for this signal. Often this is referred to as an “unbalanced circuit,” or “single ended circuit.” In such “unbalanced circuits” when wires cross or run parallel with one another, there can be undesired coupling.

One method for reducing such coupling is to use two wires, one for the signal, the other for the signal return path, and no ground plane return path. In AC signals, either wire can be considered to be the signal, and the other the signal return. To minimize coupling to other circuits, it is highly desired that the signal current flowing in the two wires be exactly the same, and 180 degrees out of phase. That is, all of the return current for one wire of the pair is carried by the other wire, and the circuit is balanced. This results in no return current being carried by the ground plane. In practice, such perfectly balanced, or differential, currents are only a theoretical goal.

An amplifier that uses balanced or differential input and output connections is less likely to have oscillations caused by input and output signals coupling, and less extraneous noise introduced by the surrounding circuitry. For this reason, practically all high gain operational amplifiers are differential. A “balun” is a component that converts an unbalanced source to a balanced one, and vice versa. Sometimes a balun is made with nearly complete isolation between the balanced terminals and ground. Sometimes a balun is made with each balanced terminal referenced to ground, but with equal and opposite voltages appearing at these terminals. These are both valid baluns, but in one case, the unbalanced voltage encounters high impedance to ground, making unbalanced current flow difficult, while in the other, any unbalanced current encounters a short circuit to ground, minimizing the voltage that enters the balanced circuit.

Microwave baluns can be either of these types, or even a mixture of the two. In any case, one could connect two equal unbalanced loads to the two balanced terminals, with their ground terminals connected together to ground. Ideally, the unbalanced signal input to the balun would be equally distributed to the two unbalanced loads. Thus, a balun could be used as a power divider or combiner, where the two unbalanced loads or sources connected to the balanced terminals would be operating 180 degrees out of phase.

At microwave frequencies, it is very difficult to fabricate well balanced circuits, as small parasitic elements can unbalance the signals. A well balanced power divider or combiner that operates over a wide microwave bandwidth is thus a very important component, and one that supplies differential, 180 degree out of phase outputs is most desirable because of its independence from currents flowing in the ground plane.

SUMMARY

In one example, a combiner/divider circuit may include first, second, third, fourth, and fifth transmission lines each including a signal conductor and a signal-return conductor. The signal conductor at a first end of the first transmission line may form a first unbalanced signal terminal forming a sum port and the signal conductors at first ends of the second and third transmission lines may form a first pair of component signal terminals, and the signal conductors at first ends of the fourth and fifth transmission lines may form a second pair of component signal terminals. The signal conductor at a second end of the first transmission line may be connected in a connection region to the signal conductors at second ends of the fourth and fifth transmission lines. The signal conductors at second ends of the second and third transmission lines may be connected in the connection region to the signal-return conductors at second ends of the fourth and fifth transmission lines, respectively. The signal-return conductor at the second end of the first transmission line may be directly connected to the signal-return conductors at the second ends of the second and third transmission lines. The second ends of the first, second, and third transmission lines may extend in a first common direction into the connection region. In some examples, the second ends of the fourth and fifth transmission lines may extend in a second common direction into the connection region.

DETAILED DESCRIPTION

Figure 1:
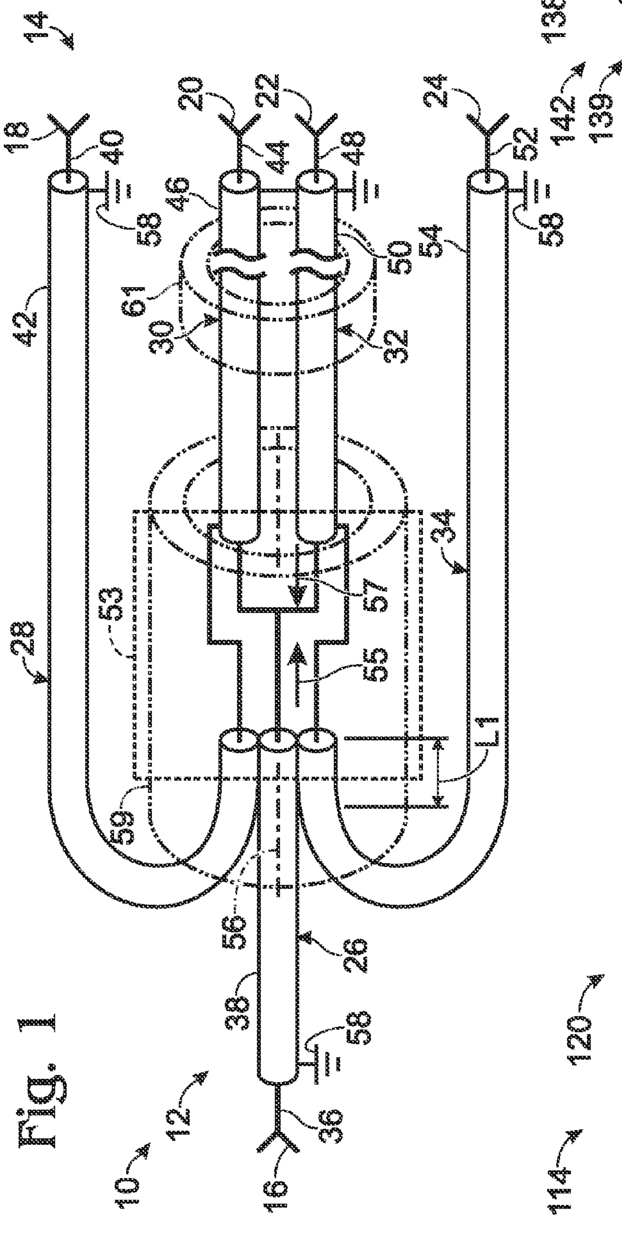
FIG. 1 is a general circuit schematic of a combiner/divider circuit.

Referring initially to FIG. 1, a combiner/divider circuit 10 may include a balun 12 coupled to a signal combining/dividing assembly 14 for transmitting a signal between a sum or combined-signal terminal or port 16 and a plurality of component-signal terminals or ports 18, 20, 22, and 24. Each port may be a place where characteristics of combiner/divider 10 may be defined, whether accessible or not. A combiner/divider circuit may also be referred to as a combiner/divider, divider/combiner, divider, or combiner, it being understood that signals and power may be conducted either direction through them to either combine multiple inputs into a single output or to divide a single input into multiple outputs.

Balun 12 may be formed of a transmission line 26. Combining/dividing assembly 14 may include transmission lines 28, 30, 32, 34 corresponding to ports 18, 20, 22, 24, respectively. Transmission lines 28, 30, 32, 34 may have differing lengths depending on the intended phase relationships desired at the component-signal ports. In some examples, transmission lines 28, 30, 32, 34 may have equal lengths.

These transmission lines may be of different forms as is well known in the art, such as coaxial transmission lines, twisted pair, strip lines, coplanar waveguides, slot lines, or microstrip lines, or a combination of such transmission lines. Coaxial transmission lines are illustrated in the example shown in FIG. 1 as well as in the other figures, it being understood that other forms of transmission lines may also be used.

Each transmission line includes at least a pair of electrically spaced-apart inductively coupled conductors that conduct or transmit a signal defined by the voltage differences between the at least a pair of conductors. One conductor is referred to as a signal conductor and the other conductor is referred to as a signal return conductor. In some types of transmission lines a signal-return conductor may be a shield conductor, as in a coaxial transmission line or a strip line, and a signal return conductor may be referred to as a ground conductor, whether or not it is connected to a local ground, a circuit ground, a system ground, or an earth ground.

As mentioned, in this example, the transmission lines are coaxial transmission lines each having a center conductor, also referred to as a signal conductor, and a shield conductor, also referred to as a shielding conductor or a signal-return conductor. More specifically, transmission line 26 includes a center conductor 36 and a shield conductor 38; transmission line 28 includes a center conductor 40 and a shield conductor 42; transmission line 30 includes a center conductor 44 and a shield conductor 46; transmission line 32 includes a center conductor 48 and a shield conductor 50; and transmission line 34 includes a center conductor 52 and a shield conductor 54.

To provide a frame of reference, the ends of the transmission lines that are interconnected in a connection region 53 are referred to as the first ends, and the ends that are associated with the identified ports are referred to as the second ends. The first end of the center conductor 36 of coaxial transmission line 26 is connected in the connection region to the first ends of the center conductors 44, 48 of coaxial transmission lines 30, 32. The first ends of center conductors 40, 52 of coaxial transmission lines 28, 34 are connected, respectively, to the first ends of shield conductors 46, 50 in connection region 53, as shown.

In this example transmission lines 26, 28, and 34 extend into connection region 53 in a first direction 55 parallel to a line 56. Transmission lines 30 and 32 extend into connection region 53 in a second direction 57, which in this example is also parallel to line 56 and opposite in direction to direction 55. Directions 55 and 57 may extend along respective lines that are transverse to each other in some examples.

A balun, such as balun 12, constructed with a coaxial transmission line 26 has a shield conductor 38 grounded to circuit ground 58 at the second end associated with port 16 and a signal voltage exists on the center conductor 36. The voltage between the conductors stays the same, but the voltage on each conductor relative to ground gradually changes so that the voltage relative to circuit ground on the center conductor is half the applied voltage, and the voltage on the first end of the shield conductor is the negative of the voltage on the center conductor, since the two voltages are 180-degrees out of phase.

In this example, however, the second ends of the shield conductors 42 and 54 of coaxial transmission lines 28 and 34 are connected along a length L1 of the conductors to a corresponding length of the second end of the shield conductor of the transmission line 26. The resulting voltages on the first ends of center conductors 40 and 52 are applied to the shield conductors 46 and 50 of coaxial transmission lines 30 and 32.

The second ends of the shield conductors 42, 46, 50, and 54 are each connected to circuit ground 58, making the resulting signals at ports 18, 20, 22, 24 unbalanced relative to circuit ground.

By connecting the first ends of shield conductors 38, 42 and 54 of coaxial transmission lines 26, 28, 34, the shield conductors have the same voltage levels. The three connected first ends of coaxial transmission lines 26, 28, 30 may extend through a common ferrite loop or sleeve 59, shown in dash-double-dot lines that surrounds or substantially surrounds the coaxial transmission lines. In this example, ferrite sleeve 59 extends from the first ends of transmission lines 26, 28, 30, across connection region 53 to the first ends of transmission line 30, 32.

In some transmission lines a ferrite sleeve or loop may not completely surround the transmission line, such as in planar transmission line structures. Such a ferrite may be used to choke signals on the shield conductors relative to circuit ground, giving combiner/divider 10 higher bandwidth and reduced losses, thereby permitting higher power applications. By extending ferrite sleeve 59 across the connection region capacitance to ground on conductors in the ferrite sleeve are substantially reduced, thereby increasing impedance to ground. The result is that losses are reduced and high frequency performance is enhanced. The alignment of the transmission lines as shown allows a single ferrite sleeve to be placed around more than one transmission line, to choke the terminals and interconnections in the connection region. This structure also allows the choking with a ferrite sleeve that has a relatively small size, thereby reducing the size of the combiner/divider. The benefits of ferrite sleeve 59 may be provided in part by a sleeve on the first ends of transmission lines 26, 28, 34, and in part by a ferrite sleeve on transmission lines 30, 32. When two sleeves are used, they may be contiguous or spaced apart.

The shields of coaxial transmission lines 30 and 32 have substantially the same voltages to circuit ground, and corresponding circuit performance characteristics may also be realized by extending coaxial transmission lines 30 and 32 through a common ferrite sleeve 61.

In this example, for a given voltage applied to combined-signal port 16, the component signals on ports 18, 20, 22 and 24 are in phase, and are approximately half the voltage applied to port 16.

Figure 2:
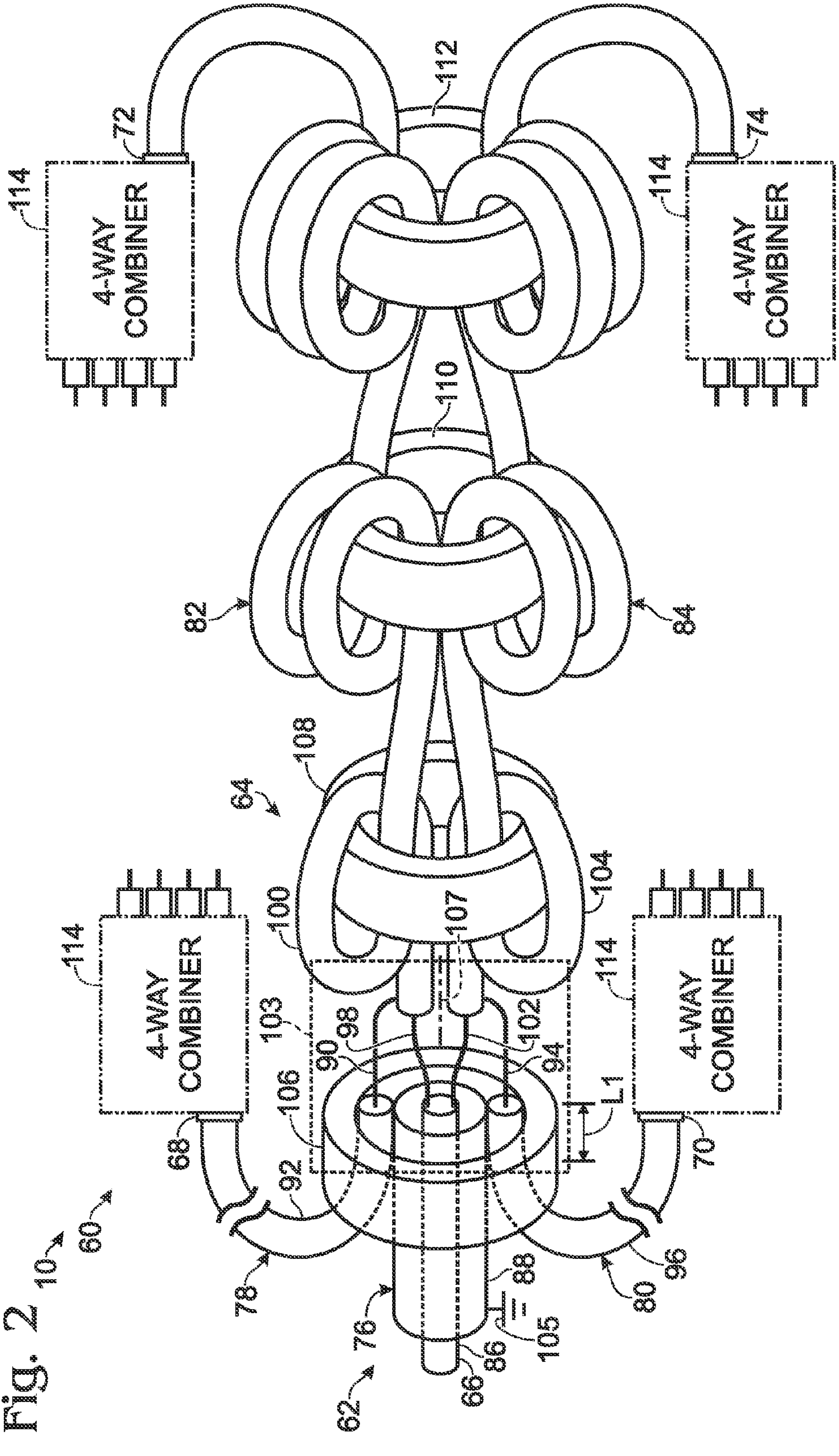
FIG. 2 is an example of a combiner/divider circuit incorporating the combiner/divider circuit of FIG. 1.

FIG. 2 illustrates a combiner/divider 60, which may be an embodiment of a combiner/divider circuit 10 with 4-way combiners added. As with combiner/divider circuit 10, combiner/divider circuit 60 may include a balun 62 coupled to a signal combining/dividing assembly 64 for transmitting a signal between a combined-signal port 66 and a plurality of component-signal ports 68, 70, 72, and 74. Balun 62 may be formed of a transmission line 76. Combining/dividing assembly 64 may include transmission lines 78, 80, 82, 84 corresponding to ports 68, 70, 72, 74, respectively. For use as a power divider or combiner, transmission lines 78, 80, 82, 84 preferably have equal lengths.

In this example, the transmission lines are coaxial transmission lines each having a center conductor, also referred to as a signal conductor, and a shield conductor, also referred to as a shielding conductor or a signal-return conductor. More specifically, transmission line 76 includes a center conductor 86 and a shield conductor 88; transmission line 78 includes a center conductor 90 and a shield conductor 92; transmission line 80 includes a center conductor 94 and a shield conductor 96; transmission line 82 includes a center conductor 98 and a shield conductor 100; and transmission line 84 includes a center conductor 102 and a shield conductor 104.

Combiner/divider circuit 60 may be used for high power applications. To accommodate high power requirements, center conductor 86 may be tubular instead of a solid wire. Additionally, shield conductor 88 may be a rigid pipe or tube rather than a woven conductor fabric as is common for low power coaxial transmission lines. Since coaxial transmission lines 78, 80, 82, 84 share the power conducted by coaxial transmission line 76, they may be smaller and flexible, with each conducting about one fourth of the power of coaxial transmission line 76. Shield conductor 88 of coaxial transmission line 76 may have a diameter that is at least twice a diameter of the shield conductors 92 and 96 of each of the coaxial transmission lines 78 and 80.

A first end of the center conductor 86 of coaxial transmission line 76 is connected to first ends of the center conductors 98, 102 of coaxial transmission lines 82, 84 in a connection region 103. First ends of center conductors 90, 94 of coaxial transmission lines 78, 80 are connected, respectively, to first ends of shield conductors 100, 104 in the connection region, as shown. Transmission lines 76, 78, 80, 82, 84 all extend into connection region 103 in directions along common line 107 to which they are respectively parallel. It is seen that transmission lines 76, 78, 80 extend into connection region 103 in a direction opposite to the direction that transmission lines 82, 84 extend into the connection region.

Coaxial transmission line 76 has a shield conductor 88 grounded to circuit ground 105 at the second end associated with port 66, and a signal voltage is applied to center conductor 86 at port 66.

In this example, the three first ends of coaxial transmission lines 76, 78, 80 are connected along length L1 and extend through a common ferrite loop 106. This ferrite loop may extend beyond the interconnections in region 103, such as is represented by connection region 103, to also cover the first ends of coaxial transmission lines 82 and 84. This minimizes the parasitic capacitance introduced by the interconnections, and increases the effectiveness of ferrite loop 106 in reducing loss. Coaxial transmission lines 82 and 84 successively wrap around ferrite sleeves 108, 110, and 112. Both of coaxial transmission lines 82 and 84 wrap around ferrite sleeve 108 one time, ferrite sleeve 110 two times, and ferrite sleeve 112 three times.

Component ports 68, 70, 72, 74 may further each be connected to a respective 4-way combiner 114, shown in dash-double-dot lines. When so configured, combiner/divider circuit 60 provides a 16-way power divider or combiner. Combiner 114 may have any design suitable for the application.

Figure 3:
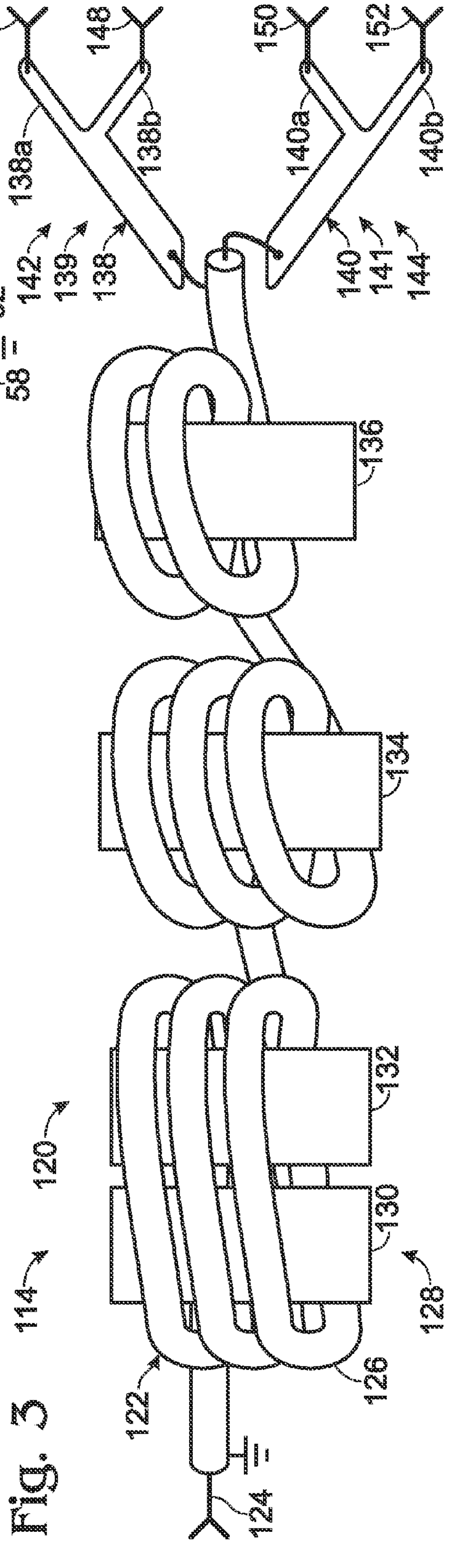
FIG. 3 is a circuit schematic of an example of a 4-way combiner/divider circuit that can be used in the combiner/divider circuit of FIG. 2.

FIG. 3 illustrates an example of a broad bandwidth 4-way power combiner 120 that may be used as 4-way combiner 114. Four-way power combiner 120 may include a coaxial transmission line 122 having a center conductor 124 and a shield conductor 126. The coaxial transmission line 122 may be wrapped around a ferrite loop assembly 128 that may include ferrite loops 130 and 132 providing in combination a high inductance choke. Coaxial transmission line 122 may further be separately wrapped around additional ferrite loops 134 and 136. In this example, the coaxial transmission line is wrapped around ferrite loop assembly 128 three times, around ferrite loop 134 three times, and around ferrite loop 136 two times.

The ends of center conductor 124 and shield conductor 126 of coaxial transmission line 122 proximate ferrite loop 136 may be connected to respective signal conductors 138, 140 of microstrip lines 139 and 141, which form respective two-way splitters 142 and 144, as shown. The ground planes or signal-return lines of the microstrip lines are not shown. Opposite ends of the microstrip lines 139 and 141 bifurcate into two respective higher impedance branches 138*a*, 138*b*, and 140*a*, 140*b*, the ends of which form component ports 146, 148, 150, 152.

Coaxial transmission line 122 may function as a balun with an unbalanced signal on the left end shown in FIG. 3, with shield conductor 126 connected to circuit ground 145 and balanced signals applied to microstrip lines 138 and 140. For impedance matching, if coaxial transmission line 122 has an impedance of 50 ohms, for example, then microstrip lines 139, 141 preferably have impedances of 25 ohms, and branches 138*a*, 138*b*, 140*a*, and 140*b* have impedances of 50 ohms.

Figure 4:
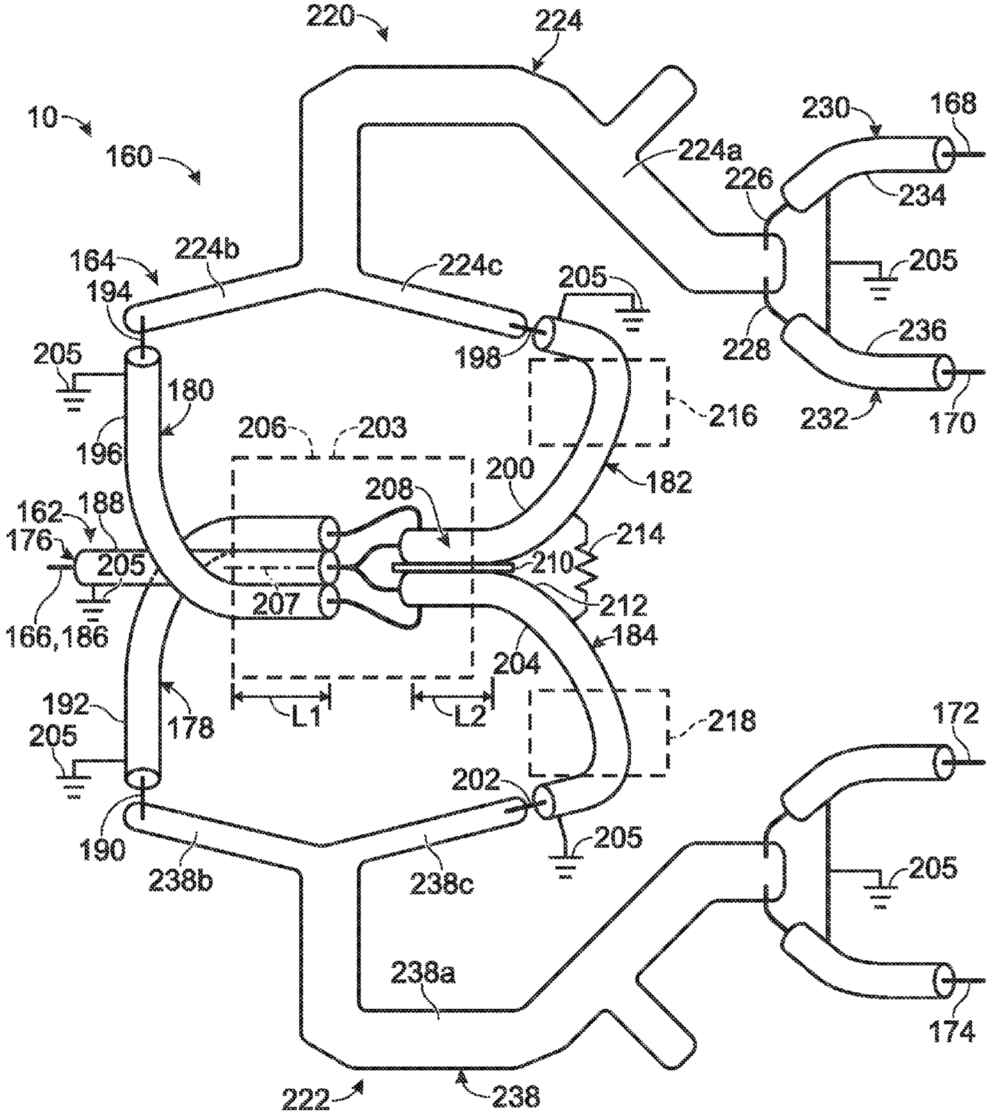
FIG. 4 is another example of a combiner/divider circuit incorporating the combiner/divider circuit of FIG. 1.

Referring now to FIG. 4, a further example of a combiner/divider circuit 160 is illustrated that may also embody the principles of combiner/divider circuit 10. As with combiner/divider circuit 10, combiner/divider circuit 160 may include a balun 162 coupled to a signal combining/dividing assembly 164 for transmitting a signal between a combined-signal port 166 and a plurality of component-signal ports 168, 170, 172, and 174. Balun 162 may be formed of a transmission line 176. Combining/dividing assembly 164 may include transmission lines 178, 180, 182, 184. For use as a power divider or combiner, transmission lines 178, 180, 182, 184 preferably have equal lengths.

In this example, the transmission lines are coaxial transmission lines each having a center conductor and a shield conductor. More specifically, transmission line 176 includes a center conductor 186 and a shield conductor 188; transmission line 178 includes a center conductor 190 and a shield conductor 192; transmission line 180 includes a center conductor 194 and a shield conductor 196; transmission line 182 includes a center conductor 198 and a shield conductor 200; and transmission line 184 includes a center conductor 202 and a shield conductor 204.

A first end of the center conductor 186 of coaxial transmission line 176 is connected to first ends of the center conductors 198, 202 of coaxial transmission lines 182, 184 in a connection region 203. First ends of center conductors 190, 194 of coaxial transmission lines 178, 180 are connected, respectively, to first ends of shield conductors 200, 204 in the connection region 203, as shown. Shield conductor 188 of coaxial transmission line 176 is grounded to circuit ground 205 at a second end associated with port 166, and a signal voltage exists in use on center conductor 186.

The first ends of coaxial transmission lines 176, 178, 180 are connected along length L1 and extend within a common ferrite loop 206 into connection region 203. In this example, ferrite loop 206 may extend over the connection region 203. Transmission lines 176, 178, 180 extend into the connection region in a direction along a line 207 that is opposite to the direction that transmission lines 182, 184 extend into the connection region. In the connection region, transmission lines 176, 178, 180, 182, and 184 extend physically in parallel along line 207.

Shield conductors 200 and 204 are inductively coupled along a length L2, thereby forming a sixth transmission line 208. The spacing between these shield conductors may be defined by a suitable dielectric element 210 positioned between them. Transmission line 208 conducts any difference in voltage between shield conductors 200 and 204 from the connection region 203 to port 212, where the resistor 214 terminates the difference-signal voltage. There is no circuit ground at this point, allowing the voltage on the two shield conductors to float. Transmission line 208 moves the difference port termination connection outside of connection region 203. With no difference port connection to avoid, ferrite loop 206 may be extended beyond region 203 and may surround at least a portion of transmission line 208. Second and third ferrite loops 216, 218 extend around portions of coaxial transmission lines 182 and 182 intermediate the second ends of the transmission lines and the location of resistor 214.

The second ends of transmission lines 180 and 182 are connected to a microstrip line 220, and second ends of transmission lines 178 and 184 are connected to a microstrip line 222. Microstrip line 220 includes a signal conductor 224 including a main section 224*a* and branch sections 224*b* and 224*c*. The second end of center conductor 194 of coaxial transmission line 180 is connected to the end of branch section 224*b*, and the second end of shield conductor 196 is connected to circuit ground 205 and the signal-return line, represented by the circuit ground, of the microstrip line 220. Similarly, the second end of center conductor 198 of coaxial transmission line 182 is connected to the end of branch section 224*c*, and the second end of shield conductor 200 is connected to circuit ground 205 and the signal-return line of the microstrip line 220. The impedances of the branch sections are twice that of the main section of the microstrip line.

The end of the main section of the signal conductor of microstrip line 220 is connected to center conductors 226 and 228 of respective terminal coaxial transmission lines 230 and 232. Respective shield conductors 234 and 236 of the terminal coaxial transmission lines are connected to circuit ground 205 and the microstrip signal-return line. The other ends of the center conductors of the terminal coaxial transmission lines form respective component ports 168 and 170.

As with microstrip line 220, microstrip line 222 includes a signal conductor 238 including a main section 238*a* and branch sections 238*b* and 238*c*. The second end of center conductor 190 of coaxial transmission line 178 is connected to the end of branch section 238*b*, and the second end of shield conductor 192 is connected to circuit ground 205 and the signal-return line, represented by the circuit ground, of the microstrip line 222. Similarly, the second end of center conductor 202 of coaxial transmission line 184 is connected to the end of branch section 238*c*, and the second end of shield conductor 204 is connected to circuit ground 205 and the signal-return line of the microstrip line 222.

The end of the main section 238*a* of the signal conductor 238 of microstrip line 222 is connected to center conductors 240 and 242 of respective terminal coaxial transmission lines 244 and 246. Respective shield conductors 248 and 250 of the terminal coaxial transmission lines are connected to circuit ground 205 and the microstrip signal-return line. The other ends of the center conductors of the terminal coaxial transmission lines form respective component ports 172 and 174.

It will be appreciated that the embodiments described above provide a combiner/divider circuit that may include first, second, third, fourth, and fifth transmission lines each including a signal conductor and a signal-return conductor. The signal conductor at a first end of the first transmission line may form a first unbalanced signal terminal or sum port and the signal conductors at first ends of the second and third transmission lines may form a first pair of component balanced signal terminals, and the signal conductors at first ends of the fourth and fifth transmission lines may form a second pair of component balanced signal terminals. The signal conductor at a second end of the first transmission line may be connected in a connection region to the signal conductors at second ends of the fourth and fifth transmission lines. The signal conductors at second ends of the second and third transmission lines may be connected in the connection region to the signal-return conductors at second ends of the fourth and fifth transmission lines, respectively. The signal-return conductor at the second end of the first transmission line may be directly connected along a connection length of the first transmission line to the signal-return conductors at the second ends of the second and third transmission lines.

Various variations may be provided. In some examples, the second ends of the first, second, and third transmission lines may extend in a first common direction into the connection region. In some examples, the second ends of the fourth and fifth transmission lines may extend in a second common direction into the connection region. The first and second directions may be opposite directions. The first, second, third, fourth, and fifth transmission lines may extend into the connection region along to a common line. The first, second, and third, transmission lines may extend physically in parallel into the connection region. The fourth and fifth transmission lines may extend physically in parallel into the connection region. The first, second, third, fourth, fifth, and sixth transmission lines extend into the connection region parallel to a common line.

A signal-return conductor of the first transmission line may be in electrical contact with the signal-return conductors of the second and third transmission lines along a length of the first transmission line that is parallel with the second and third transmission lines. The fourth and fifth transmission lines each may include signal-return conductors that are inductively coupled proximate to the connection region and form thereby a sixth transmission line.

In some examples, a ferrite sleeve may substantially surround the second ends of the first, second, and third transmission lines in the connection region. A ferrite sleeve may surround the second ends of the fourth and fifth transmission lines in the connection region. A ferrite sleeve may substantially surround ends of the first, second, third, fourth, fifth, and sixth transmission lines in the connection region and extend across the connection region over the interconnections between the second ends of the respective transmission lines. A second ferrite sleeve may substantially surround respective portions of both the fourth and fifth transmission lines spaced from the first ferrite sleeve and the connection region.

The above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled. Accordingly, while embodiments of combiner/divider circuits have been particularly shown and described, many variations may be made therein. This disclosure may include one or more independent or interdependent inventions directed to various combinations of features, functions, elements and/or properties, one or more of which may be defined in the following claims. Other combinations and sub-combinations of features, functions, elements and/or properties may be claimed later in this or a related application. Such variations, whether they are directed to different combinations or directed to the same combinations, whether different, broader, narrower or equal in scope, are also regarded as included within the subject matter of the present disclosure.

An appreciation of the availability or significance of claims not presently claimed may not be presently realized. Accordingly, the foregoing embodiments are illustrative, and no single feature or element, or combination thereof, is essential to all possible combinations that may be claimed in this or a later application. Each claim defines an invention disclosed in the foregoing disclosure, but any one claim does not necessarily encompass all features or combinations that may be claimed. Where the claims recite "a" or "a first" element or the equivalent thereof, such claims include one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated.

Ordinal indicators may be applied to associated elements in the order in which they are introduced in a given context, and the ordinal indicators for such elements may be different in different contexts.

INDUSTRIAL APPLICABILITY

The methods and apparatus described in the present disclosure are applicable to radio frequency communications, radar, and other industries in which combiner/divider devices are used.

The invention claimed is:

1. A combiner/divider circuit comprising: first, second, third, fourth and fifth transmission lines each including a signal conductor and a signal-return conductor;

- the signal conductor at a first end of the first transmission line forming a first unbalanced signal terminal forming a sum port and the signal conductors at first ends of the second and third transmission lines forming a first pair of component signal terminals, and the signal conductors at first ends of the fourth and fifth transmission lines forming a second pair of component signal terminals;
- the signal conductor at a second end of the first transmission line being connected in a connection region to the signal conductors at second ends of the fourth and fifth transmission lines;
- the signal conductors at second ends of the second and third transmission lines being connected in the connection region to the signal-return conductors at the second ends of the fourth and fifth transmission lines, respectively;
- the signal-return conductor at the second end of the first transmission line being directly connected to the signal-return conductors at the second ends of the second and third transmission lines; and
- the second ends of the first, second, and third transmission lines extending in a first common direction into the connection region.

2. The combiner/divider circuit of claim 1, further comprising a first ferrite sleeve substantially surrounding the second ends of the first, second, and third transmission lines in the connection region.

3. The combiner/divider of claim 2, wherein the first ferrite sleeve further surrounds the second ends of the fourth and fifth transmission lines in the connection region.

4. The combiner/divider circuit of claim 2, further comprising at least a second ferrite sleeve substantially surrounding respective portions of both the fourth and fifth transmission lines spaced from the first ferrite sleeve and the connection region.

5. The combiner/divider circuit of claim 1, wherein the second ends of the fourth and fifth transmission lines extend in a second common direction into the connection region.

6. The combiner/divider circuit of claim 5, wherein the first and second common directions are opposite directions.

7. The combiner/divider circuit of claim 1, wherein the first, second, third, fourth, and fifth transmission lines extend into the connection region along to a common line.

8. The combiner/divider circuit of claim 1, wherein the first, second, and third transmission lines are coaxial transmission lines and each of the signal conductors is a center conductor and each of the signal-return conductors is a shield conductor surrounding the center conductor, the first, second, and third, transmission lines extending physically in parallel into the connection region.

9. The combiner/divider circuit of claim 8, wherein the signal-return conductor of the first transmission line is in electrical contact with the signal-return conductors of the second and third transmission lines along a length of the first transmission line that is parallel with the second and third transmission lines.

10. The combiner/divider circuit of claim 8, wherein the fourth and fifth transmission lines are coaxial transmission lines that extend physically in parallel into the connection region.

11. The combiner/divider circuit of claim 10, wherein the fourth and fifth transmission lines each includes a shield conductor, the shield conductors of the fourth and fifth transmission lines being inductively coupled proximate to the connection region and forming thereby a sixth transmission line.

12. The combiner/divider circuit of claim 11, wherein the first, second, third, fourth, fifth, and sixth transmission lines extend into the connection region parallel to a common line.

13. The combiner/divider circuit of claim 12, further comprising a ferrite sleeve substantially surrounding ends of the first, second, third, fourth, fifth, and sixth transmission lines in the connection region.

14. A combiner/divider circuit comprising: first, second, third, fourth and fifth transmission lines each including a signal conductor and a signal-return conductor; the signal conductor at a first end of the first transmission line forming a first unbalanced signal terminal forming a sum port and the signal conductors at first ends of the second and third transmission lines forming a first pair of component signal terminals, and the signal conductors at first ends of the fourth and fifth transmission lines forming a second pair of component signal terminals; the signal conductor at a second end of the first transmission line being connected in a connection region to the signal conductors at second ends of the fourth and fifth transmission lines; the signal conductors at second ends of the second and third transmission lines being connected in the connection region to the signal-return conductors at the second ends of the fourth and fifth transmission lines, respectively; the signal-return conductor at the second end of the first transmission line being directly connected to the signal-return conductors at the second ends of the second and third transmission lines; and the second ends of the fourth and fifth transmission lines extending in a first common direction into the connection region.

15. The combiner/divider circuit of claim 14, wherein the fourth and fifth transmission lines are coaxial transmission lines that extend physically in parallel into the connection region.

16. The combiner/divider circuit of claim 15, wherein the fourth and fifth transmission lines each includes a shield conductor, the shield conductors of the fourth and fifth transmission lines being inductively coupled proximate to the connection region and forming thereby a sixth transmission line.

17. The combiner/divider circuit of claim 14, wherein the fourth, fifth, and sixth transmission lines extend into the connection region parallel to a common line.

18. The combiner/divider of claim 17, further comprising a first ferrite sleeve surrounding the second ends of the fourth and fifth transmission lines in the connection region.

19. The combiner/divider circuit of claim 18, further comprising at least a second ferrite sleeve substantially surrounding respective portions of both the fourth and fifth transmission lines spaced from the first ferrite sleeve and the connection region.

* * * * *